United States Patent
Wan

(10) Patent No.: US 10,937,514 B2
(45) Date of Patent: Mar. 2, 2021

(54) METHOD OF PROGRAMMING MULTILEVEL CELL NAND FLASH MEMORY DEVICE AND MLC NAND FLASH MEMORY DEVICE

(71) Applicant: Yangtze Memory Technologies Co., Ltd., Wuhan (CN)

(72) Inventor: Wei Jun Wan, Wuhan (CN)

(73) Assignee: Yangtze Memory Technologies Co., Ltd., Hubei (CN)

(*) Notice: Subject to any disclaimer, the term of this patent is extended or adjusted under 35 U.S.C. 154(b) by 70 days.

(21) Appl. No.: 16/513,658

(22) Filed: Jul. 16, 2019

(65) Prior Publication Data
US 2020/0372963 A1 Nov. 26, 2020

Related U.S. Application Data

(63) Continuation of application No. PCT/CN2019/087903, filed on May 22, 2019.

(51) Int. Cl.
*G11C 16/34* (2006.01)
*G11C 16/12* (2006.01)
*G11C 16/26* (2006.01)
*G11C 11/56* (2006.01)

(52) U.S. Cl.
CPC ...... *G11C 16/3459* (2013.01); *G11C 11/5628* (2013.01); *G11C 16/12* (2013.01); *G11C 16/26* (2013.01)

(58) Field of Classification Search
CPC . G11C 16/3459; G11C 11/5628; G11C 16/12; G11C 16/26
See application file for complete search history.

(56) References Cited

U.S. PATENT DOCUMENTS

| | | |
|---|---|---|
| 7,548,464 B2 | 6/2009 | Kim |
| 7,881,115 B2 | 2/2011 | Kim |
| 8,717,823 B2 | 5/2014 | Kim |
| 9,437,311 B1 | 9/2016 | Teng |
| 2002/0154545 A1 | 10/2002 | Tanaka |
| 2004/0032774 A1 | 2/2004 | Hirano |
| 2008/0062765 A1 | 3/2008 | Tu |
| 2008/0106944 A1 | 5/2008 | Kim |

(Continued)

FOREIGN PATENT DOCUMENTS

| | | |
|---|---|---|
| CN | 101174471 A | 5/2008 |
| CN | 101783177 A | 7/2010 |

(Continued)

*Primary Examiner* — Han Yang
(74) *Attorney, Agent, or Firm* — Winston Hsu

(57) ABSTRACT

A method of programming a NAND flash memory device includes: a programming voltage generation circuit applying an initial programming voltage pulse to a predetermined page of NAND flash memory; a controller verifying a plurality of verification levels of the predetermined page, the plurality of verification levels being less than a first-state verification voltage of verifying a lowest program state of the predetermined page; the controller determining a magnitude of a subsequent programming voltage pulse upon one of the plurality of verification levels of the predetermined page passing a verification; and the programming voltage generation circuit applying the subsequent programming voltage pulse to the predetermined page.

20 Claims, 6 Drawing Sheets

(56) References Cited

U.S. PATENT DOCUMENTS

| | | |
|---|---|---|
| 2010/0182839 A1 | 7/2010 | Kim |
| 2011/0122705 A1 | 5/2011 | Park |
| 2012/0075932 A1 | 3/2012 | Moschiano |
| 2012/0236654 A1 | 9/2012 | Hemink |
| 2015/0146484 A1 | 5/2015 | Lee |
| 2015/0262675 A1 | 9/2015 | Lin |
| 2016/0099070 A1* | 4/2016 | Jiang .................. G11C 16/26 365/185.21 |
| 2016/0300620 A1* | 10/2016 | Dutta ................ G11C 16/0483 |
| 2017/0242632 A1 | 8/2017 | Cho |
| 2018/0061503 A1 | 3/2018 | Lee |

FOREIGN PATENT DOCUMENTS

| | | |
|---|---|---|
| CN | 102422362 A | 4/2012 |
| CN | 104916323 A | 9/2015 |
| CN | 106328203 A | 1/2017 |
| CN | 107123442 A | 9/2017 |
| CN | 107799147 A | 3/2018 |

\* cited by examiner

METHOD OF PROGRAMMING MULTILEVEL CELL NAND FLASH MEMORY DEVICE AND MLC NAND FLASH MEMORY DEVICE

CROSS REFERENCE TO RELATED APPLICATIONS

This is a continuation of PCT patent application No. PCT/CN2019/087903, filed on 22 May 2019 and included herein by reference in its entirety.

BACKGROUND OF THE INVENTION

1. Field of the Invention

The invention relates to semiconductor devices, and specifically, to a method of programming a multilevel cell (MLC) NAND flash memory device and an MLC NAND flash memory device.

2. Description of the Prior Art

NAND Flash memories are widely adopted for non-volatile data storage in mobile devices and consumer electronics, and store data in an array of memory cells by programming the memory cells into different program states. In a single level cell (SLC) flash memory, a memory cell has two possible program states, and in a 2-bit multi-level cell (MLC) flash memory, a memory cell has four possible program states. Flash memory may employ several read levels corresponding to the different program states to read data from the memory cells.

In general, memory cells may be set to various program states by applying corresponding programming voltages thereto. However, the memory cells may degrade and shifts of the programming voltages may occur over time. As a result, it is important to determine the programming voltages, and especially a start programming pulse of a flash memory prior to programming.

Incremental Step Pulse Programming (ISPP) is one method often used to identify programming voltages. In ISPP, a series of programming pulses are applied to select memory cells to gradually raise the threshold voltage of the memory cells to above a specific threshold level, and upon reaching the specific threshold level a programming voltage can be identified. However, when the shift of the programming voltage is large, it might take a long time for ISPP to detect programming voltages as a large number of programming pulses has to be applied to memory cells in order to establish the required threshold voltage.

It is desirable to provide a flash memory device and a method to reduce the time for determining a start programming voltage and other programming voltages.

SUMMARY OF THE INVENTION

In one embodiment of the invention, a method of programming a NAND flash memory device includes: a programming voltage generation circuit applying an initial programming voltage pulse to a predetermined page of NAND flash memory; a controller verifying a plurality of verification levels of the predetermined page, the plurality of verification levels being less than a first-state verification voltage of reading a lowest program state of the predetermined page; the controller determining a magnitude of a subsequent programming voltage pulse upon one of the plurality of verification levels of the predetermined page passing a verification; and the programming voltage generation circuit applying the subsequent programming voltage pulse to the predetermined page.

In another embodiment of the invention, a NAND flash memory device includes NAND flash memory, a programming voltage generation circuit and a controller. The NAND flash memory includes a predetermined page and other pages. The programming voltage generation circuit is coupled to the NAND flash memory and used to apply an initial programming voltage pulse to the predetermined page. The controller is coupled to the NAND flash memory and the programming voltage generation circuit, and used to verify a plurality of verification levels of the predetermined page, and determine a magnitude of a subsequent programming voltage pulse upon one of the plurality of verification levels of the predetermined page passing a verification. The plurality of verification levels are less than a first-state verification voltage of verifying a lowest program state of the predetermined page. The programming voltage generation circuit is further used to apply the subsequent programming voltage pulse to the predetermined page.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
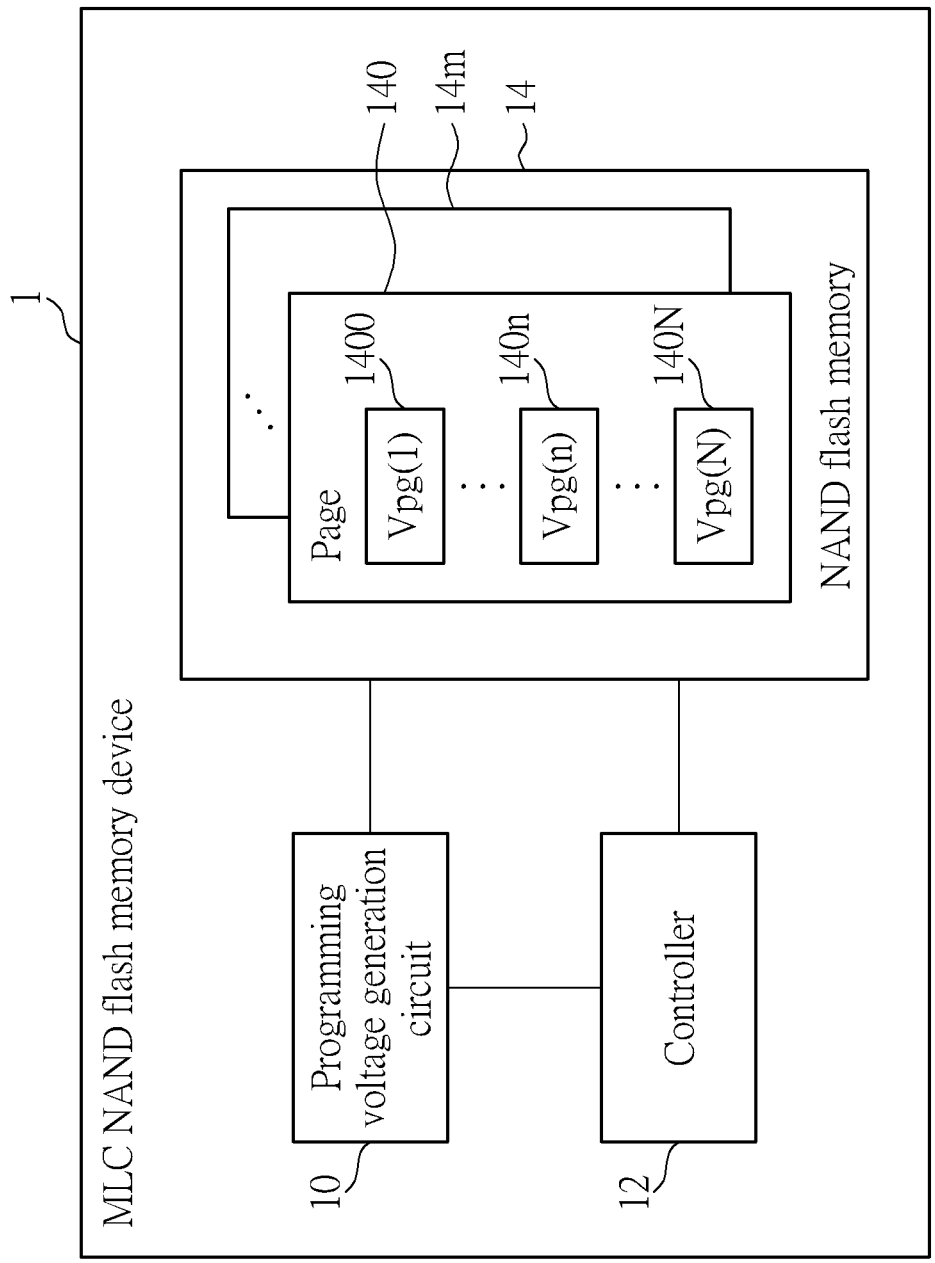
FIG. 1 is a block diagram of a multilevel cell (MLC) NAND flash memory device according to an embodiment of the invention.

FIG. 1 is a block diagram of a multilevel cell (MLC) NAND flash memory device 1 according to an embodiment of the invention. The MLC NAND flash memory device 1 comprises a programming voltage generation circuit 10, a controller 12 and NAND flash memory 14. The programming voltage generation circuit 10 is coupled to the NAND flash memory 14, and the controller 12 is coupled to the programming voltage generation circuit 10 and the NAND flash memory 14 to control operations thereof. The NAND flash memory 14 comprises a plurality of pages 140 through 14m, where m is a positive integer. Each of the pages 140 through 14m comprises a plurality of memory cells arranged in an array, and each memory cell may be programmed into one of N possible program states, where N may be 8. Specifically, each memory cell may be programmed into a lowest program state using a start programming voltage Vpg(1), and into higher program states using higher-state programming voltages Vpg(n), with n being a positive integer between 2 and 8. Since the start programming voltage Vpg(1) and higher-state programming voltages Vpg(n) may be shifted over time, the MLC NAND flash device 1 may perform a multilevel verification to determine the start programming voltage Vpg(1) and the higher-state programming voltages Vpg(n) when required. More particularly, the MLC NAND flash memory device 1 may determine the programming voltages Vpg(1) through Vpg(N) after a predetermined page has undergone a predetermined count of program cycles, e.g., every 100 program cycles, thereby correcting shifts of the programming voltages Vpg(1) through Vpg(N). The start programming voltage Vpg(1) and the higher-state programming voltages Vpg(n) of selected memory cells in the predetermined page, e.g., the page 140 may be detected, and stored in selected locations 1400, 140n, 140N of the predetermined page 140. Subsequently, the controller 12 may utilize the start programming voltage Vpg(1) and the higher-state programming voltages Vpg(n) to program the predetermined page 140 or other pages 140m in the NAND flash memory 14.

The programming voltage generation circuit 10 may apply an initial programming voltage pulse to the predetermined page 140. In particular, the programming voltage generation circuit 10 may apply the initial programming voltage pulse to gate terminals of the selected memory cells of the predetermined page 140 via word lines. The initial programming voltage pulse may be a default factory setting conservatively chosen in order to accommodate fast memory cell variations, page-to-page variations and block-to-block variations.

The controller 12 may verify a plurality of verification levels of the predetermined page 140, and determine a magnitude of a subsequent programming voltage pulse upon one of the plurality of verification levels of the predetermined page 140 passing a verification. The determination of the subsequent programming voltage pulse is referred to as a dynamic start voltage (DSV) process. Then the programming voltage generation circuit 10 may further apply the subsequent programming voltage pulse to the predetermined page 140. The plurality of verification levels are less than a first-state verification voltage PV(1) of verifying the lowest program state of the predetermined page 140. In particular, the controller 12 may verify the plurality of verification levels by verifying a verification level of the predetermined page 140 and reducing the verification level to generate a lower verification level when the verification level is verified as failed, and may determine the magnitude of the subsequent programming voltage pulse by determining the magnitude of the subsequent programming voltage pulse according to a difference between the verification level and the first-state verification voltage when the verification level is verified as passed. Further, the controller 12 may reduce the verification level by decrementing the verification level by a fixed amount to generate the lower verification level. The first verification level to be verified may be the first-state verification voltage PV(1). For example, the first-state verification voltage PV(1) may be −0.8V. The fixed amount may be a step voltage equivalent to a step pulse produced by the programming voltage generation circuit 10. For example, the fixed amount may be 0.4V.

The controller 12 may verify the verification level as passed when one or more of the selected memory cells of the predetermined page 140 are read successfully using the verification level, and verify the verification level as failed when none of the selected memory cells of the predetermined page 140 are read successfully using the verification level. In particular, the controller 12 may verify the verification level by applying the verification level to the word lines of the selected cells of the predetermined page 140 to read the program states and determine a count of memory cells being read successfully as a fill bit count (FBC).

The controller 12 may further verify the first-state verification voltage PV(1), determine the start programming voltage Vpg(1) of the predetermined page 140 according to the initial programming voltage pulse and the subsequent programming voltage pulse when the first-state verification voltage PV(1) is verified as passed, and store the start programming voltage Vpg(1) to the memory location 1400 of the predetermined page 140. More specifically, the start programming voltage Vpg(1) may be determined by summing the initial programming voltage pulse and the subsequent programming voltage pulse. In one embodiment, when it is required to program a memory cell in the predetermined page 140 or another predetermined page 14n to the lowest program state, the controller 12 may read the start programming voltage Vpg(1) from the memory location 1400, and control the programming voltage generation circuit 10 to program the memory cell using the start programming voltage Vpg(1).

Furthermore, the controller 12 may determine a higher-state programming voltage Vpg(n) according to a verification of a higher-state verification voltage PV(n), and adjust when to verify a higher-state verification voltage PV(n) according to a number of failed verifications of the plurality of verification levels of the predetermined page 140, where n is a positive integer between 2 and 8. The higher-state programming voltage Vpg(n) is used to program the selected memory cells into a higher program state n, and the higher-state verification voltage PV(n) is a verification level of verifying the higher program state n. Generally speaking, determination of the higher-state programming voltage Vpg(n) may be performed using an incremental step pulse programming (ISPP) procedure, in which the selected memory cells in the predetermined page 140 are programmed using a set of fixed-size step pulses generated by the programming voltage generation circuit 10, so as to increment threshold voltages of the selected memory cells in a stepwise manner. The controller 12 may regularly verify a corresponding higher-state verification voltage PV(n) as the threshold voltages of the selected memory cells are raised progressively, and identify the higher-state programming voltage Vpg(n) as a summation of all programming pulses upon the corresponding higher-state verification voltage PV(n) being verified as passed. Further, since the higher-state programming voltages Vpg(2) through Vpg(8) have progressively higher voltage levels, the determinations of the higher-state programming voltages Vpg(2) through Vpg(8) may start sequentially after the determination of the start programming voltage Vpg(1), with the higher-state programming voltages Vpg(2) being the first and the higher-state programming voltages Vpg(8) being the last. For example, the determination of the higher-state programming voltages Vpg(2) may start at the 5th step pulse of the ISPP procedure, and the determination of the higher-state programming voltages Vpg(3) may start at the 10th step pulse of the ISPP procedure.

In the embodiment, the controller 12 may adjust when to verify a higher-state verification voltage PV(n) by configuring a start step pulse count for starting a verification of the higher-state verification voltage PV(n), and incrementing the start step pulse when the verification level is verified as failed. In particular, the controller 12 may increment the start step pulse count by a fixed count of the step pulses such as 1 step pulse. When an accumulated count of step pulses applied to the selected memory cells of the predetermined page 140 exceeds the start step pulse count, the controller 12 may start verifying the higher-state verification voltage PV(n); whereas when the accumulated count is less than the start step pulse count, the controller 12 may not verify the higher-state verification voltage PV(n). When the higher-state verification voltage PV(n) is verified as passed, The controller 12 may save an accumulation of step pulses as the higher-state programming voltages Vpg(n) to the memory location 140n. Later, when it is required to program a memory cell into the program state n, the controller 12 may read the higher-state programming voltages Vpg(n) from the memory location 140n, and control the programming voltage generation circuit 10 to program the memory cell using the higher-state programming voltage Vpg(n).

The MLC NAND flash memory device 1 is not limited to an MLC approach and 8 program states, a single-level cell (SLC) approach or other numbers of program states may be adopted. The MLC NAND flash memory device 1 utilizes the multilevel verification to reduce the number of programming voltage pulses to be applied to the predetermined page 140 in order to determine the start programming voltage Vpg(1), thereby speeding up the start programming voltage Vpg(1) determination process considerably for a large start programming voltage shift.

Figure 2:
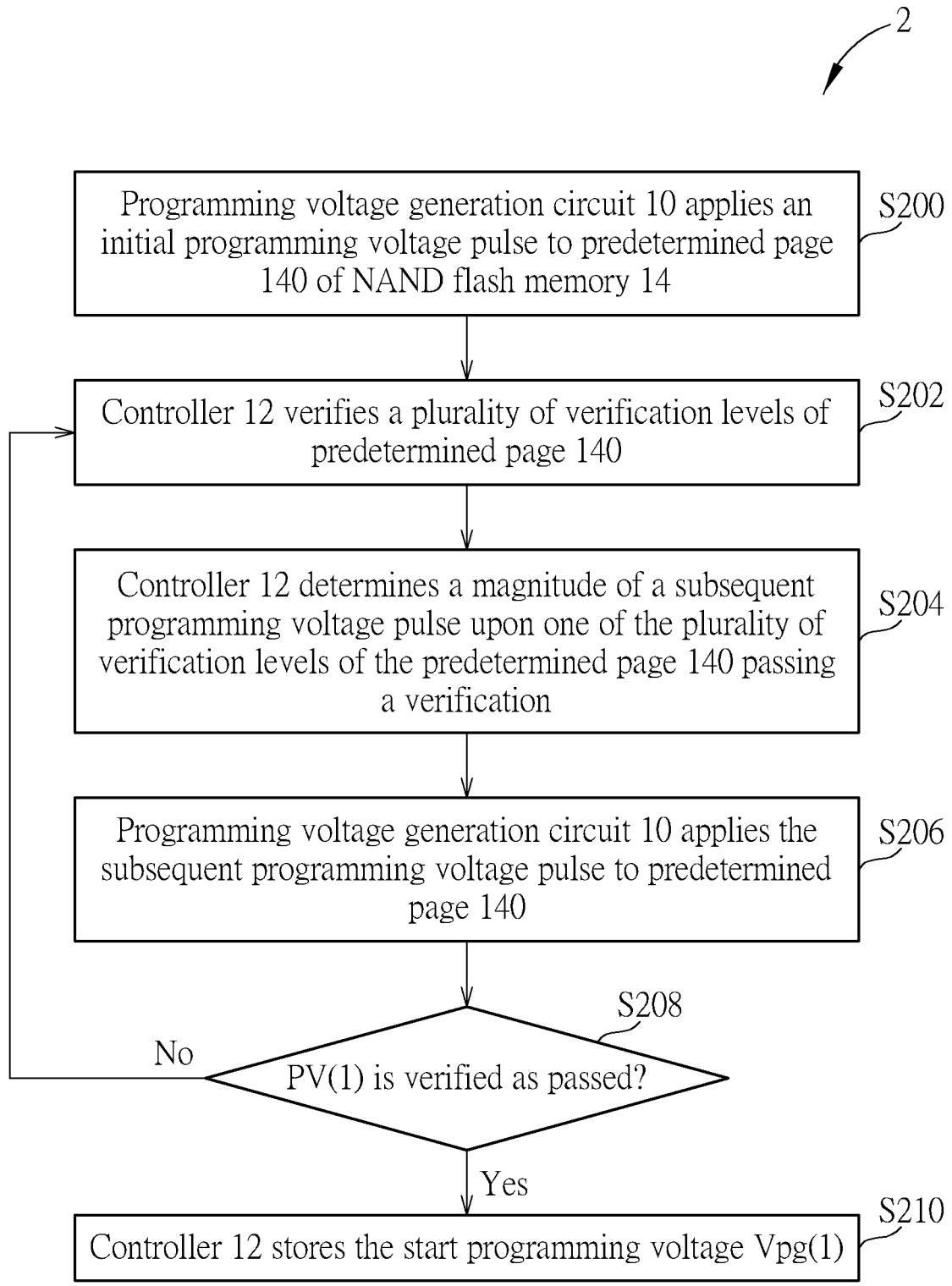
FIG. 2 is a flowchart of a method of determining a start programming voltage of the MLC NAND flash memory device in FIG. 1.

FIG. 2 is a flowchart of a method 2 of determining the start programming voltage Vpg(1) of the MLC NAND flash memory device 1 in FIG. 1. The method 2 comprises Steps S200 through S210. Any reasonable technological change or step adjustment is within the scope of the disclosure. Steps S200 through S210 are explained as follows:

Step S200: Programming voltage generation circuit 10 applies an initial programming voltage pulse to predetermined page 140 of NAND flash memory 14;

Step S202: Controller 12 verifies a plurality of verification levels of predetermined page 140;

Step S204: Controller 12 determines a magnitude of a subsequent programming voltage pulse upon one of the plurality of verification levels of the predetermined page 140 passing a verification;

Step S206: Programming voltage generation circuit 10 applies the subsequent programming voltage pulse to predetermined page 140;

Step S208: Controller 12 determines whether the first-state programming voltage PV(1) is verified as passed? If so, go to Step S210, if not, go to Step S202;

Step S210: Controller 12 stores the start programming voltage Vpg(1).

Figure 3:
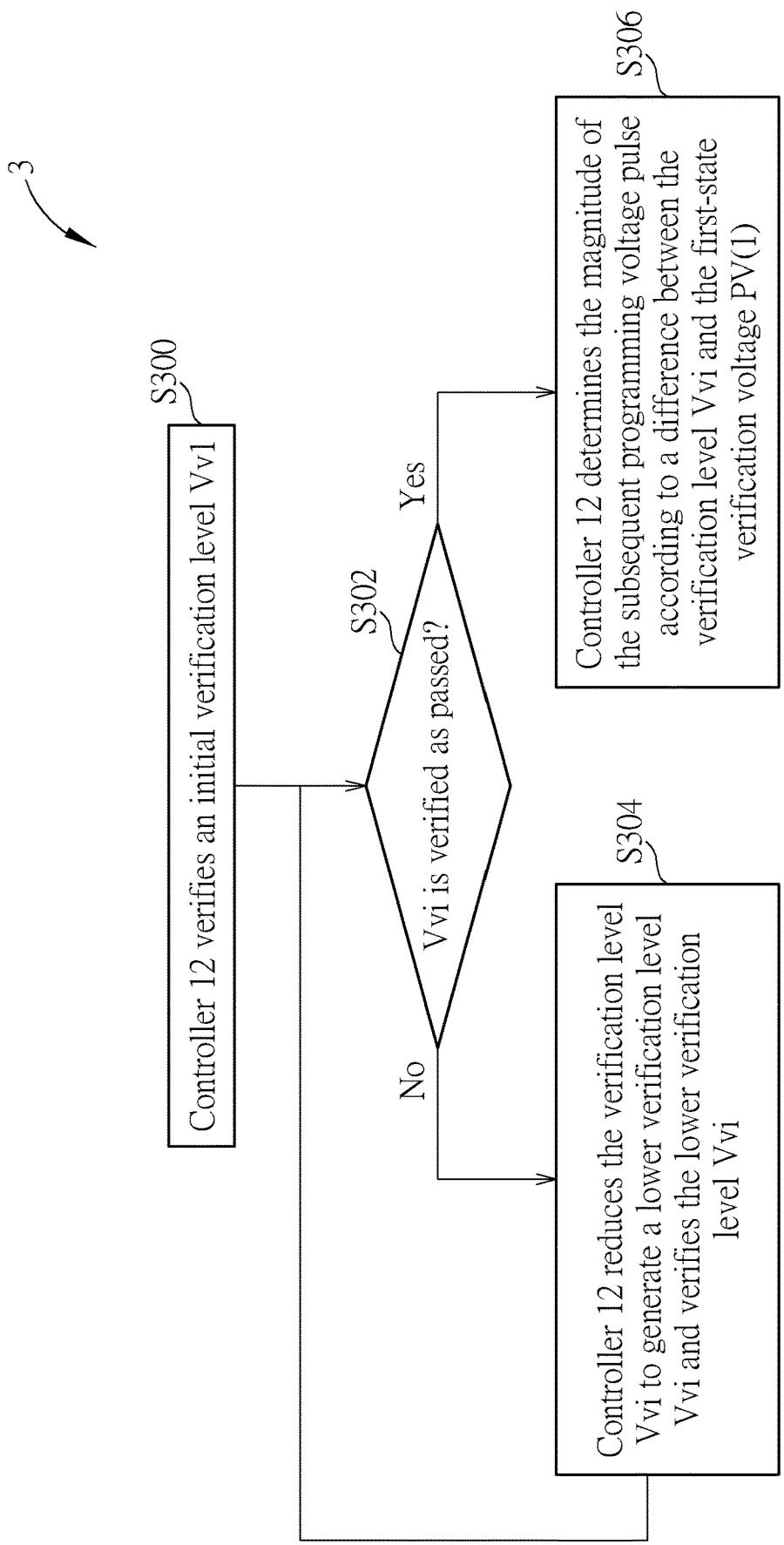
FIG. 3 is a flowchart of a method of determining a subsequent programming voltage pulse for use in the method in FIG. 2.

Upon startup, the programming voltage generation circuit 10 applies an initial programming voltage pulse to the predetermined page 140 (S200), the controller 12 employs a multilevel verification by sequentially verifying a plurality of verification levels of predetermined page 140 (S202). The plurality of verification levels may start with first-state verification voltage PV(1) and follow by one or more descending verification levels. Eventually, one of the plurality of verification levels may be verified as passed and used to determine the start programming voltage Vpg(1) and a subsequent programming voltage pulse producing the same. Accordingly, the controller 12 determines a magnitude of the subsequent programming voltage pulse upon a successful verification of the verification level (S204), the programming voltage generation circuit 10 applies the subsequent programming voltage pulse to predetermined page 140 (S206), and the controller 12 then verifies the first-state programming voltage PV(1) (S208). If the first-state programming voltage PV(1) is verified as passed, a combination of the initial programming voltage pulse and the subsequent programming voltage pulse may be regarded as the start programming voltage Vpg(1), and the controller 12 stores the start programming voltage Vpg(1) into the memory location 1400 (S210). If the first-state programming voltage PV(1) is verified as failed, Steps S202 through S208 are repeated until first-state programming voltage PV(1) is verified as passed. Steps S202 and S204 may be detailed by a method 3 in FIG. 3, in which determination of the subsequent programming voltage pulse is explained.

The method 3 comprises Steps S300 through S306 and is used to verify the plurality of verification levels Vvi, with i being a positive integer. Any reasonable technological change or step adjustment is within the scope of the disclosure. Steps S300 through S306 are explained as follows:

Step S300: Controller 12 verifies an initial verification level Vv1;

Step S302: Controller 12 determines whether the verification level Vvi is verified as passed? If so, go to Step S304, if not, go to Step S306;

Step S304: Controller 12 reduces the verification level Vvi to generate a lower verification level Vvi and verifies the lower verification level Vvi; go to Step S302;

Step S306: Controller 12 determines the magnitude of the subsequent programming voltage pulse according to a difference between the verification level Vvi and the first-state verification voltage PV(1).

Upon startup, the controller 12 verifies an initial verification level Vv1 of the first-state verification voltage PV(1) (S300), and the controller 12 determines whether the verification level Vv1 is verified as passed (S302). If so, the MLC NAND flash memory device 1 may be newly manufactured and the initial programming voltage pulse may be the start programming voltage Vpg(1), the controller 12 determines the magnitude of the subsequent programming voltage pulse according to a difference between the initial verification level Vv1 and the first-state verification voltage PV(1) (S306), and thus no subsequent programming voltage pulse will be applied to the predetermined page 1400 since the initial programming voltage pulse is already the start programming voltage Vpg(1). If verification level Vv1 is not verified as passed, the controller 12 reduces the verification level Vv1 by a decrement to generate a lower verification level Vv2 and verifies the lower verification level Vv2 (S304) and determines whether the verification level Vv2 is verified as passed (S302). The decrement may be a fixed amount corresponding to a step pulse produced by the programming voltage generation circuit 10. If the verification level Vv2 is verified as passed, the start programming voltage Vpg(1) may be a combination of the initial programming voltage pulse and the step pulse, the controller 12 determines the magnitude of the subsequent programming voltage pulse according to a difference between the verification level Vv2 and the first-state verification voltage PV(1) (S306). Since the difference is just the fixed amount of the decrement, the subsequent programming voltage pulse will be one step pulse corresponding to fixed amount of the decrement. If verification level Vv2 is not verified as passed, the controller 12 reduces the verification level Vv2 by another decrement to generate a lower verification level Vv3 (S304). Steps S302 and S304 are repeated continuously until the verification level Vvi is successfully verified and the magnitude of the subsequent programming voltage pulse can be determined.

Figure 4:
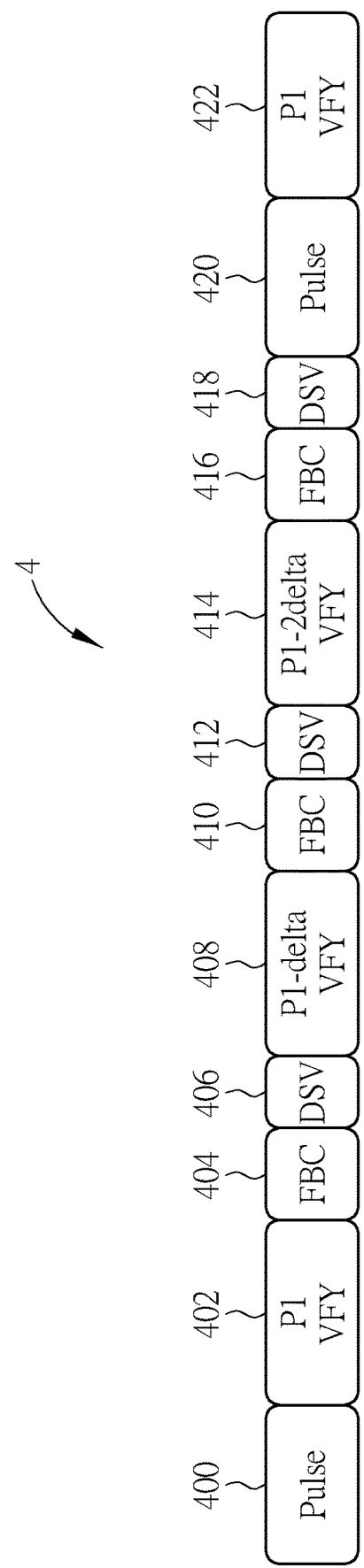
FIG. 4 shows a schematic diagram of a start programming voltage determination method employing a 2-level verification according to an embodiment of the invention.

FIG. 4 shows a schematic diagram of a start programming voltage determination method 4 employing a 2-level verification according to an embodiment of the invention. The start programming voltage determination method 4 comprises Processes 400 through 422, where Processes 400 through 406 are used to perform an initial programming voltage pulse check, Processes 408 through 418 are used to perform the 2-level verification to determine a start programming voltage Vpg(1), and Processes 420 and 422 are used to confirm the start programming voltage Vpg(1). The voltage pulse process 400 employs an initial programming voltage pulse and the voltage pulse process 420 employs a subsequent programming voltage pulse. The start programming voltage determination method 4 can achieve determination of the start programming voltage Vpg(1) by using only two voltage pulses 400, 420, reducing the time required for determining the start programming voltage Vpg(1).

Figure 5:
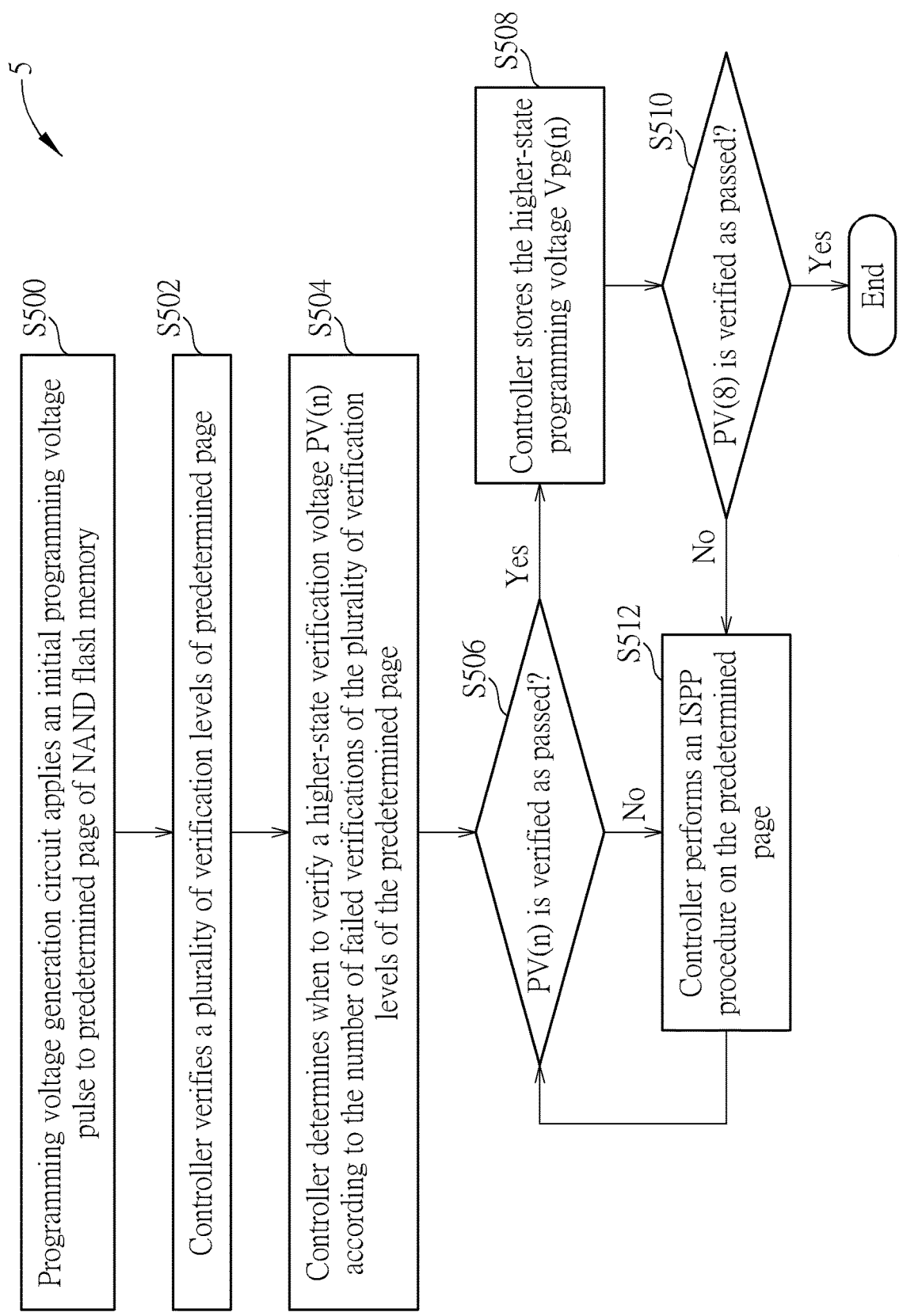
FIG. 5 is a flowchart of a method of determining a higher-state programming voltage of the MLC NAND flash memory device in FIG. 1.

FIG. 5 is a flowchart of a method 5 of determining a higher-state programming voltage Vpg(n) of the MLC NAND flash memory device 1 in FIG. 1. The method 5 comprises Steps S500 through S512. Steps S500 and S502 are used to perform the multilevel verification, details therefor are provided in Steps S200 and S202 and will not be repeated here for brevity. Steps S504 to S512 are used to determine the higher-state programming voltage Vpg(n), where n is a positive integer between 2 and 8. Any reasonable technological change or step adjustment is within the scope of the disclosure. Steps S500 through S512 are provided as follows:

Step S500: Programming voltage generation circuit applies an initial programming voltage pulse to a predetermined page of NAND flash memory;

Step S502: Controller verifies a plurality of verification levels of predetermined page;

Step S504: Controller determines when to verify a higher-state verification voltage PV(n) according to the number of failed verifications of the plurality of verification levels of the predetermined page;

Step S506: Controller determines whether the higher-state verification voltage PV(n) is verified as passed? If so, go to Step S508, if not, go to Step S512;

Step S508: Controller stores the higher-state programming voltage Vpg(n);

Step S510: Controller determines whether the highest-state programming voltage PV(8) is verified as passed? If so, exit the method 5, if not, go to Step S512;

Step S512: Controller performs an ISPP procedure on the predetermined page; go to Step S506.

The controller determines when to verify a higher-state verification voltage PV(n) according to the number of failed verifications of the plurality of verification levels of the predetermined page (S504). Specifically, since the higher-state programming voltage Vpg(n) may be shifted by approximately the same amount as the start programming voltage Vpg(1), the controller may skip a verification of the higher-state verification voltage PV(n) and push back the verification by one step pulse when a verification level of the predetermined page is verified as failed. Likewise, the controller may skip a number of verifications of the higher-state verification voltage PV(n) and postpone the verification by the same number of step pulses when the same number of verification levels of the predetermined page are verified as failed in Step S502. When the time comes to verify the higher-state verification voltage PV(n), the controller determines whether the higher-state verification voltage PV(n) is verified as passed (S506), if so, the controller stores an accumulation of step pulses applied to the predetermined page as the higher-state programming voltage Vpg(n) (S508), determine whether the highest-state verification voltage PV(8) is verified as passed (S510), and exit the method 5 when the highest-state verification voltage PV(8) is verified as passed. If the higher-state verification voltage PV(n) is not verified as passed, the controller performs an ISPP procedure on the predetermined page by applying a step pulse to the predetermined page (S512), and Steps S506 through S512 are repeated until the highest-state verification voltage PV(8) is verified as passed. If the highest-state verification voltage PV(8) is not verified as passed, the controller continues performing the ISPP procedure on the predetermined page (S512), and Steps S506 through S5 are repeated until the highest-state verification voltage PV(8) is verified as passed.

Figure 6:
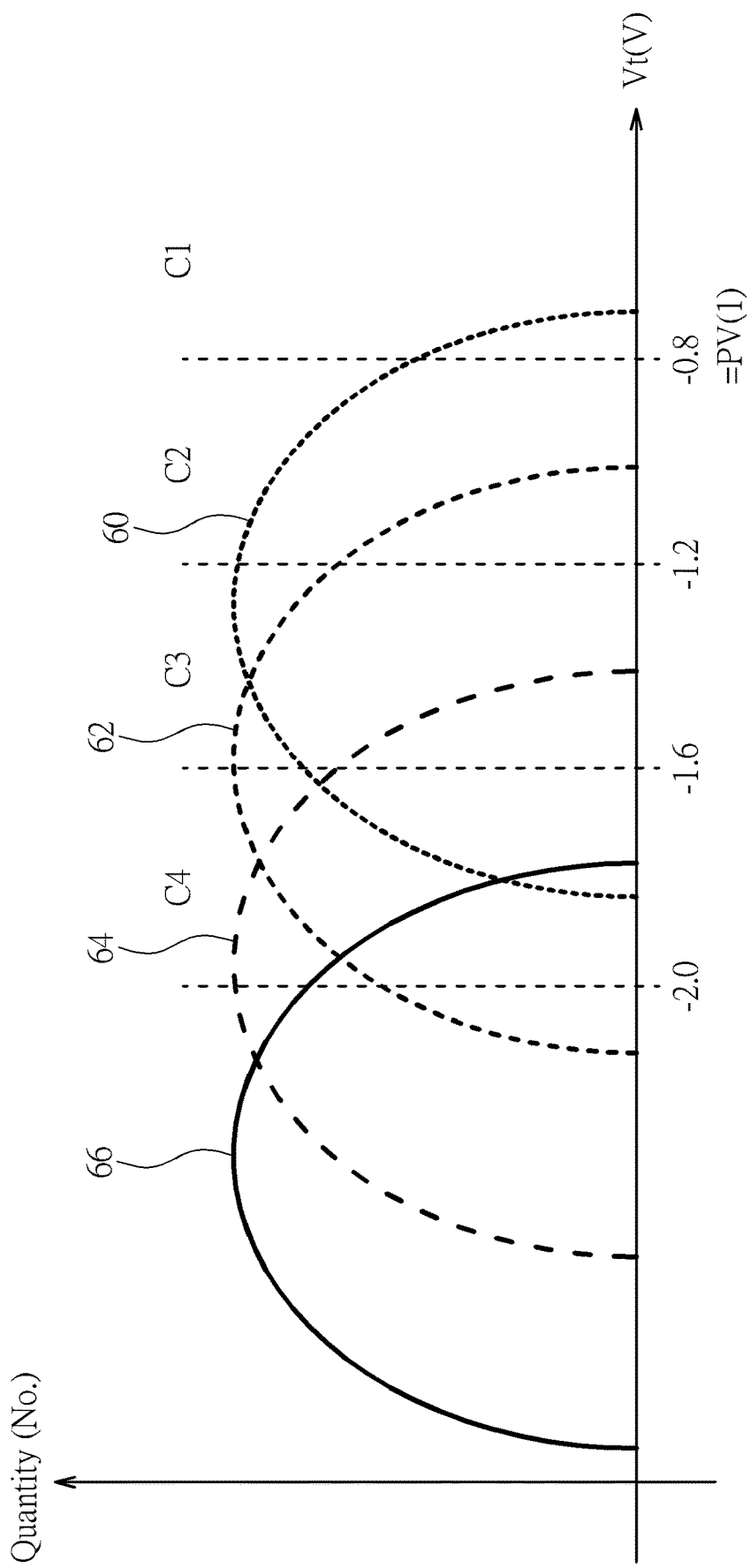
FIG. 6 shows 4 threshold voltage distributions of memory cells.

FIG. 6 shows 4 threshold voltage distributions 60, 62, 64, 66 of memory cells after an initial programming voltage pulse is applied thereto, where the x-axis represents a threshold voltage Vt in volts, and the y-axis represents a quantity in number of memory cells. The first-state verification voltage PV(1) is located at −0.8. FIG. 6 also shows 4 voltage divisions at −0.8, −1.2, −1.6 and −2.0, separated by a fixed voltage difference corresponding to a step pulse generated by a programming voltage generation circuit. Table 1 illustrates the time saved by the present invention in comparison to the ISPP method in the related art, where dVPGM represents 1 step pulse, P represents the time for a programming voltage pulse, V represents the time for a verification, FBC represents the time for a fill bit check, and MLV represents the time for a multi-level verification. Each of the threshold voltage distributions 60, 62, 64, 66 contains faster memory cells located at an upper portion of the threshold voltage distribution. Specifically, the faster memory cells of the threshold voltage distributions 60, 62, 64, 66 are located in Ranges C1, C2, C3, C4, respectively. As a result, the threshold voltages Vt of the faster memory cells of the threshold voltage distributions 60, 62, 64, 66 are respectively 0, 1, 2, 3 voltage differences lower than the first-state verification voltage PV(1), and correspondingly, the start programming voltages Vpg(1) of the threshold voltage distributions 60, 62, 64, 66 are respectively 0, 1, 2, 3 step pulses higher than the initial programming voltage pulse. As indicated in the last column in Table 1, the time saved by the present invention comparing to the ISPP method increases considerably as the threshold voltage distribution is shifted further towards the left. For example, the time saved in the threshold voltage distribution 62 is the time for 6 verifications, and the time saved in the threshold voltage distribution 62 is the time for 2 pulses and 20 verifications.

TABLE 1

| Range | Dynamic start voltage | Vpg(1) detection time (present invention) | Vpg(1) detection time (ISPP method) | Skipped higher-state verification (present invention) | Time saved |
|---|---|---|---|---|---|
| C1 | 0 | 1 P + 1 V + 1FBC | 1 P + 1 V + 1FBC | 0 | 0 |

TABLE 1-continued

| Range | Dynamic start voltage | Vpg(1) detection time (present invention) | Vpg(1) detection time (ISPP method) | Skipped higher-state verification (present invention) | Time saved |
|---|---|---|---|---|---|
| C2 | dVPGM | 1 P + 2MLV + 2FBC + 1 P + 1 V | 2 P + 2 V + 2FBC | 1 × 7 V | −1 V + 7 V |
| C3 | 2dVPGM | 1 P + 3MLV + 3FBC + 1 P + 1 V | 3 P + 3 V + 3FBC | 2 × 7 V | 1 P − 1 V + 14 V |
| C4 | 3dVPGM | 1 P + 4MLV + 4FBC + 1 P + 1 V | 4 P + 4 V + 4FBC | 3 × 7 V | 2 P − 1 V + 21 V |

As discussed in the preceding sections, the MLC NAND flash memory device 1 and various methods in FIGS. 2 through 5 employ a multilevel verification to accelerate determination of programming voltages.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of determining a start programming voltage of a NAND flash memory device comprising:
   a programming voltage generation circuit applying an initial programming voltage pulse to a predetermined page of NAND flash memory;
   a controller verifying a plurality of verification levels of the predetermined page, the plurality of verification levels being less than a first-state verification voltage of verifying a lowest program state of the predetermined page;
   the controller determining a magnitude of a subsequent programming voltage pulse upon one of the plurality of verification levels of the predetermined page passing a verification; and
   the programming voltage generation circuit applying the subsequent programming voltage pulse to the predetermined page.

2. The method of claim 1, wherein the controller verifying the plurality of verification levels of the predetermined page comprises:
   the controller verifying a verification level of the plurality of verification levels; and
   the controller reducing the verification level to generate a lower verification level of the plurality of verification levels when the verification level is verified as failed.

3. The method of claim 2, wherein the controller reducing the first verification level comprises:
   the controller decrementing the verification level by a fixed amount to generate the lower verification level when the verification level is verified as failed.

4. The method of claim 1, wherein:
   the controller verifying the plurality of verification levels of the predetermined page comprises:
      the controller verifying a verification level of the predetermined page; and
   the controller determining the magnitude of the subsequent programming voltage pulse comprises:
      the controller determining the magnitude of the subsequent programming voltage pulse according to a difference between the verification level and the first-state verification voltage when the verification level is verified as passed.

5. The method of claim 4, wherein the verification level is verified as passed when one or more memory cells of the predetermined page are read successfully using the verification level.

6. The method of claim 1, further comprising:
   the controller verifying the first-state verification voltage;
   when the first-state verification voltage is verified as passed, the controller determining a start programming voltage of programming the lowest program state of the predetermined page according to the initial programming voltage pulse and the subsequent programming voltage pulse; and
   the controller storing the start programming voltage in the predetermined page.

7. The method of claim 6, further comprising:
   the programming voltage generation circuit programming the lowest program state for the predetermined page or another predetermined page of the NAND flash memory using the start programming voltage.

8. The method of claim 1, further comprising:
   the controller adjusting when to verify a higher-state verification voltage according to a number of failed verifications of the plurality of verification levels of the predetermined page.

9. The method of claim 8, wherein the controller adjusting when to verify the higher-state verification voltage comprises:
   the controller configuring a start step pulse count for starting a verification of the higher-state verification voltage; and
   the controller incrementing the start step pulse count when the verification level is verified as failed.

10. The method of claim 1, wherein the predetermined page has 8 program states.

11. A NAND flash memory device comprising:
    NAND flash memory comprising a predetermined page and other pages;
    a programming voltage generation circuit coupled to the NAND flash memory and configured to apply an initial programming voltage pulse to the predetermined page; and
    a controller coupled to the NAND flash memory and the programming voltage generation circuit, and configured to verify a plurality of verification levels of the predetermined page, and determine a magnitude of a subsequent programming voltage pulse upon one of the plurality of verification levels of the predetermined page passing a verification, the plurality of verification levels being less than a first-state verification voltage of verifying a lowest program state of the predetermined page;

wherein the programming voltage generation circuit is further configured to apply the subsequent programming voltage pulse to the predetermined page.

12. The NAND flash memory device of claim 11, wherein the controller is configured to verify the plurality of verification levels of the predetermined page by verifying a verification level of the predetermined page, and reducing the verification level to generate a lower verification level of the plurality of verification levels when the verification level is verified as failed.

13. The NAND flash memory device of claim 12, wherein the controller is configured to reduce the verification level of the predetermined page by decrementing the verification level of the predetermined page by a fixed amount to generate the lower verification level when the verification level is verified as failed.

14. The NAND flash memory device of claim 11, wherein the controller is configured to verify the plurality of verification levels of the predetermined page by verifying a verification level of the predetermined page, and determine the magnitude of the subsequent programming voltage pulse by determining the magnitude of the subsequent programming voltage pulse according to a difference between the verification level and the first-state verification voltage when the verification level is verified as passed.

15. The NAND flash memory device of claim 14, wherein the controller is configured to verify the verification level as passed when one or more memory cells of the predetermined page are read successfully using the verification level.

16. The NAND flash memory device of claim 11, wherein the controller is further configured to verify the first-state verification voltage, when the first-state verification voltage is verified as passed, determine a start programming voltage of programming the lowest program state of the predetermined page according to the initial programming voltage pulse and the subsequent programming voltage pulse, and store the start programming voltage in the predetermined page.

17. The NAND flash memory device of claim 16, wherein the programming voltage generation circuit is further configured to program the lowest program state for the predetermined page or another predetermined page of the NAND flash memory using the start programming voltage.

18. The NAND flash memory device of claim 11, wherein the controller is further configured to adjust when to verify a higher-state verification voltage according to a number of failed verifications of the plurality of verification levels of the predetermined page.

19. The NAND flash memory device of claim 18, wherein the controller is further configured to adjust when to verify the higher-state verification voltage by: configuring a start step pulse count for starting a verification of the higher-state verification voltage; and incrementing the start step pulse count when the verification level is verified as failed.

20. The NAND flash memory device of claim 11, wherein the predetermined page has 8 program states.

* * * * *